(12) United States Patent
Fukiharu (10) Patent No.: US 6,285,559 B1
(45) Date of Patent: Sep. 4, 2001

(54) MULTICHIP MODULE

(75) Inventor: Eiichi Fukiharu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/317,968

(22) Filed: May 25, 1999

(30) Foreign Application Priority Data

May 26, 1998 (JP) ................................. 10-144120

(51) Int. Cl.$^7$ ........................... H05K 7/02; H01L 29/00
(52) U.S. Cl. ...................... 361/760; 333/186; 333/246; 361/784
(58) Field of Search ..................... 361/748, 750, 361/762, 767, 784, 790, 761, 764, 793, 795, 803, 396, 794, 760; 257/728, 723, 724, 767–768, 791, 686, 778; 333/12, 193, 186, 246; 310/313 R (56) References Cited

U.S. PATENT DOCUMENTS

| | | | |
|---|---|---|---|
| 5,422,615 | * 6/1995 | Shibagaski et al. | 333/246 |
| 5,438,305 | * 8/1995 | Hikita et al. | 333/32 |
| 5,872,331 | * 2/1999 | Ando et al. | 174/35 R |
| 5,920,142 | * 7/1999 | Onishi et al. | 310/313 |
| 6,057,600 | * 5/2000 | Kitazawa et al. | 257/728 |
| 6,078,123 | * 6/2000 | Tanaka et al. | 310/313 R |

FOREIGN PATENT DOCUMENTS

| | | |
|---|---|---|
| 0 540 247 A2 | 5/1993 | (EP) . |
| 0 708 484 A1 | 4/1996 | (EP) . |
| 7-131129 | 5/1995 | (JP) . |
| 7-153903 | 6/1995 | (JP) . |
| 8-78616 | 3/1996 | (JP) . |
| 8-153834 | 6/1996 | (JP) . |

* cited by examiner

Primary Examiner—Jayprakash N. Gandhi
Assistant Examiner—Thanh Y. Tran
(74) Attorney, Agent, or Firm—McGuireWoods LLP (57) ABSTRACT

A multichip module (MCM) of the present invention includes a first substrate formed with through holes and having shield electrodes arranged therein. At least one semiconductor device is mounted on one major surface of the first substrate and electrically and mechanically connected to the first substrate by a first conductive material. A second substrate is mounted on the other major surface of the first substrate and formed with through holes. At least one filter device is mounted on the other major surface of the first substrate and electrically and mechanically connected to the first substrate by a second conductive material. The second substrate is electrically connected to the semiconductor device by the through holes and first conductive material. The MCM is capable of enhancing the efficient mounting of devices and promoting easy insulation between the devices.

21 Claims, 14 Drawing Sheets

MULTICHIP MODULE

BACKGROUND OF THE INVENTION

The present invention relates to a multichip module (MCM) including a semiconductor device and a surface acoustic wave (SAW) filter device mounted on a ceramic substrate.

There is an increasing demand for a miniature portable apparatus, e.g., a handy phone which is smaller in size and weight and integrated to a higher degree and features more advanced functions.

A conventional MCM constructed to meet the above demand has a problem that it cannot reduce the mounting area because a plurality of devices are arranged side by side in a hermetic container. Further, the conventional MCM is expensive and heavy. In addition, it is difficult to electrically connect the various devices because they are arranged in a single space and connected together by bonding wires.

Japanese Patent Laid-Open Publication No. 7-153903 discloses an MCM including an MCM substrate for mounting a semiconductor chip. A frame is provided on the MCM substrate in such a manner as to surround the semiconductor chip. Seal resin is filled in a gap between the frame and the semiconductor chip for sealing the chip. Electrode terminals are arranged on the surface of the frame opposite to the MCM substrate and electrically connected to circuitry formed on the substrate. The electrode terminals are implemented by solder bumps or conductive paste. The semiconductor chip is mounted on one major surface of the MCM substrate to be mounted to a motherboard. Semiconductor packages each including the above MCM substrate loaded with the semiconductor chip are stacked in order to enhance the efficient mounting of semiconductor chips. However, the mounting efficiency achievable with this configuration is limited because an LSI (Large Scale Integrated circuit) chip is mounted on only one major surface of the MCM substrate.

Technologies relating to the present invention are also disclosed in, e.g., Japanese Patent Laid-Open Publication Nos. 7-131129, 8-78616 and 8-153834.

SUMMARY OF THE INVENTION

It is therefore an object of the present invention to provide an MCM capable of enhancing the efficient mounting of devices and facilitating insulation between the devices.

An MCM of the present invention includes a first substrate formed with through holes and having shield electrodes arranged therein. At least one semiconductor device is mounted on one major surface of the first substrate and electrically and mechanically connected to the first substrate by a first conductive material. A second substrate is mounted on the other major surface of the first substrate and formed with through holes. At least one filter device is mounted on the other major surface of the first substrate and electrically and mechanically connected to the first substrate by a second conductive material. The second substrate is electrically connected to the semiconductor device by the through holes and first conductive material.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
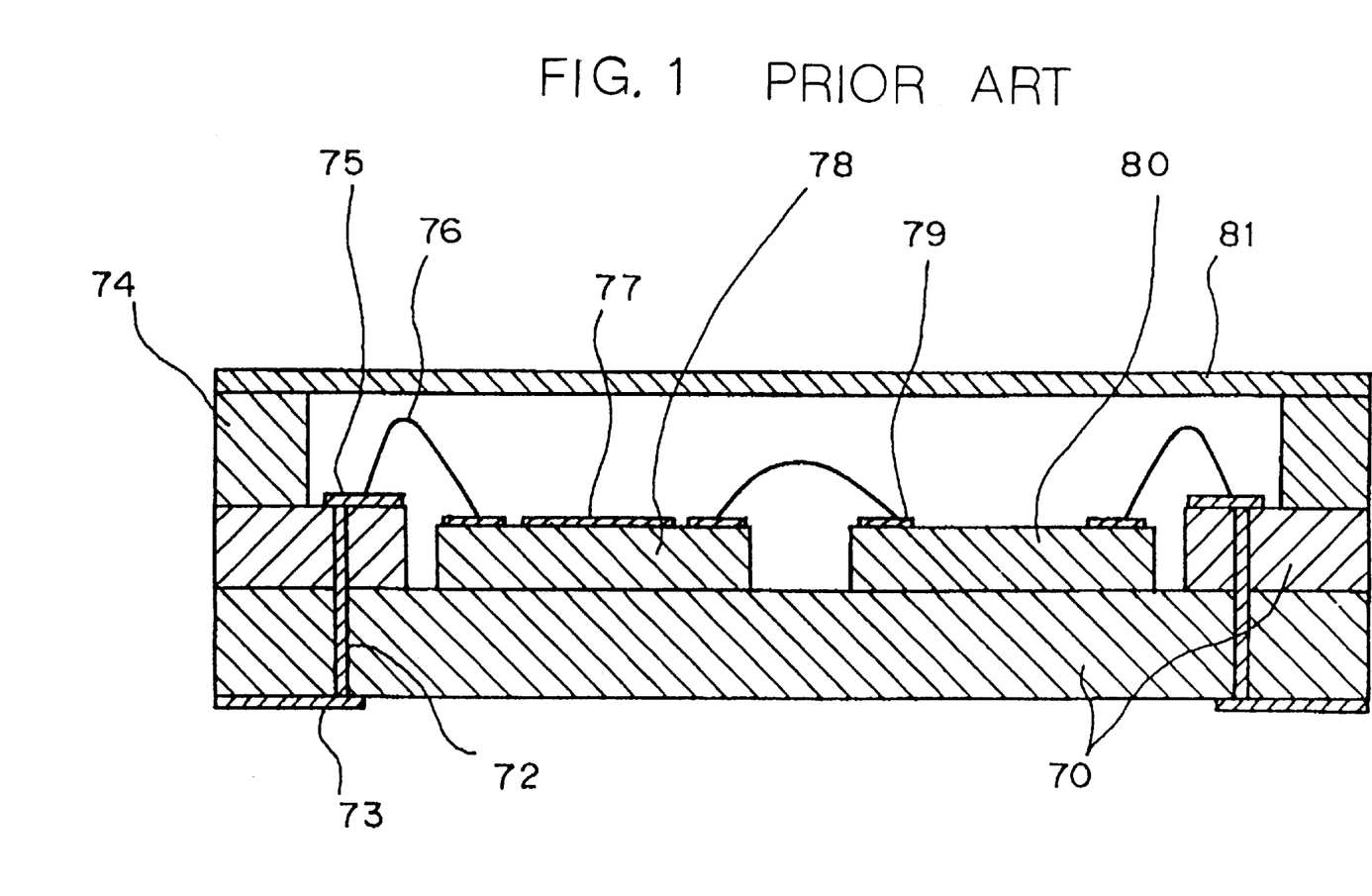
FIG. 1 is a sectional view showing one of conventional MCMs.

To better understand the present invention, brief reference will be made to one of conventional MCMs, shown in FIG. 1. As shown, the MCM includes a semiconductor device 80 and a SAW filter device 78 mounted side by side on a ceramic substrate 70. Input/output electrodes 75 and 79 are formed on the semiconductor device 80 and SAW filter device 78. Interdigital electrodes 77 are formed on the SAW filter device 78. External electrodes 73 are provided on the underside of the substrate 70, and each are electrically connected to one of the input/output electrodes 75 by a through hole 72. There are also shown in FIG. 1 a seam ring 74 for intercepting extraneous noise and a metallic cover 81.

In the above conventional MCM, the input/output electrodes 75 and 79, interdigital electrodes 77 and other structural elements are arranged side by side horizontally in a hermetic container. The MCM therefore fails to reduce the mounting area. Further, the seam ring 74 and metallic cover 81 included in the MCM in addition to the above structural elements increase the cost and weight of the MCM. In addition, it is difficult to electrically connect the various devices because they are arranged in a single space and connected together by bonding wires 76.

Preferred embodiments of the MCM in accordance with the present invention and free from the above problems will be described hereinafter.

1st Embodiment

Figure 2:
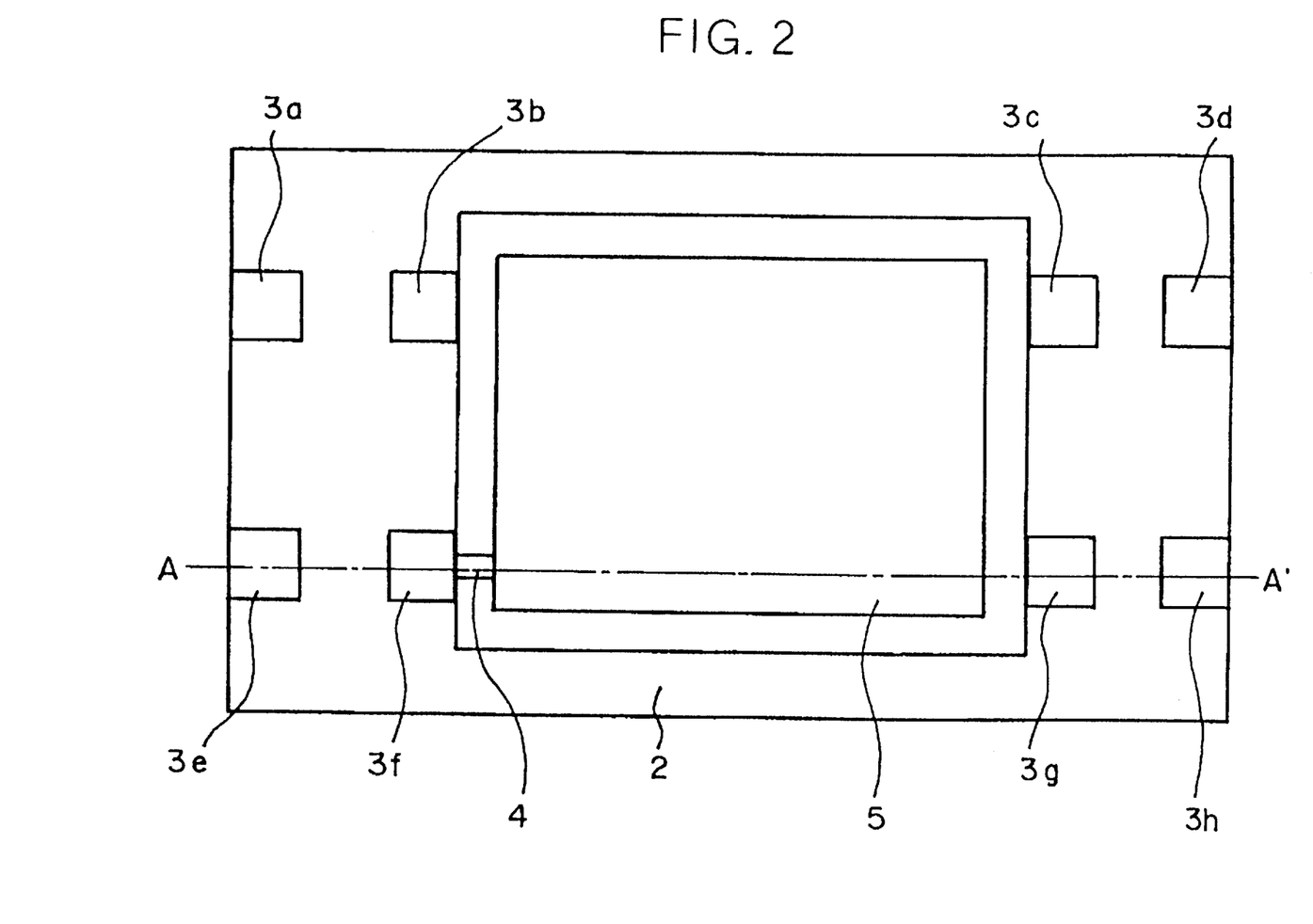
FIG. 2 is a top plan view showing a first embodiment of the MCM in accordance with the present invention.
Figure 3:
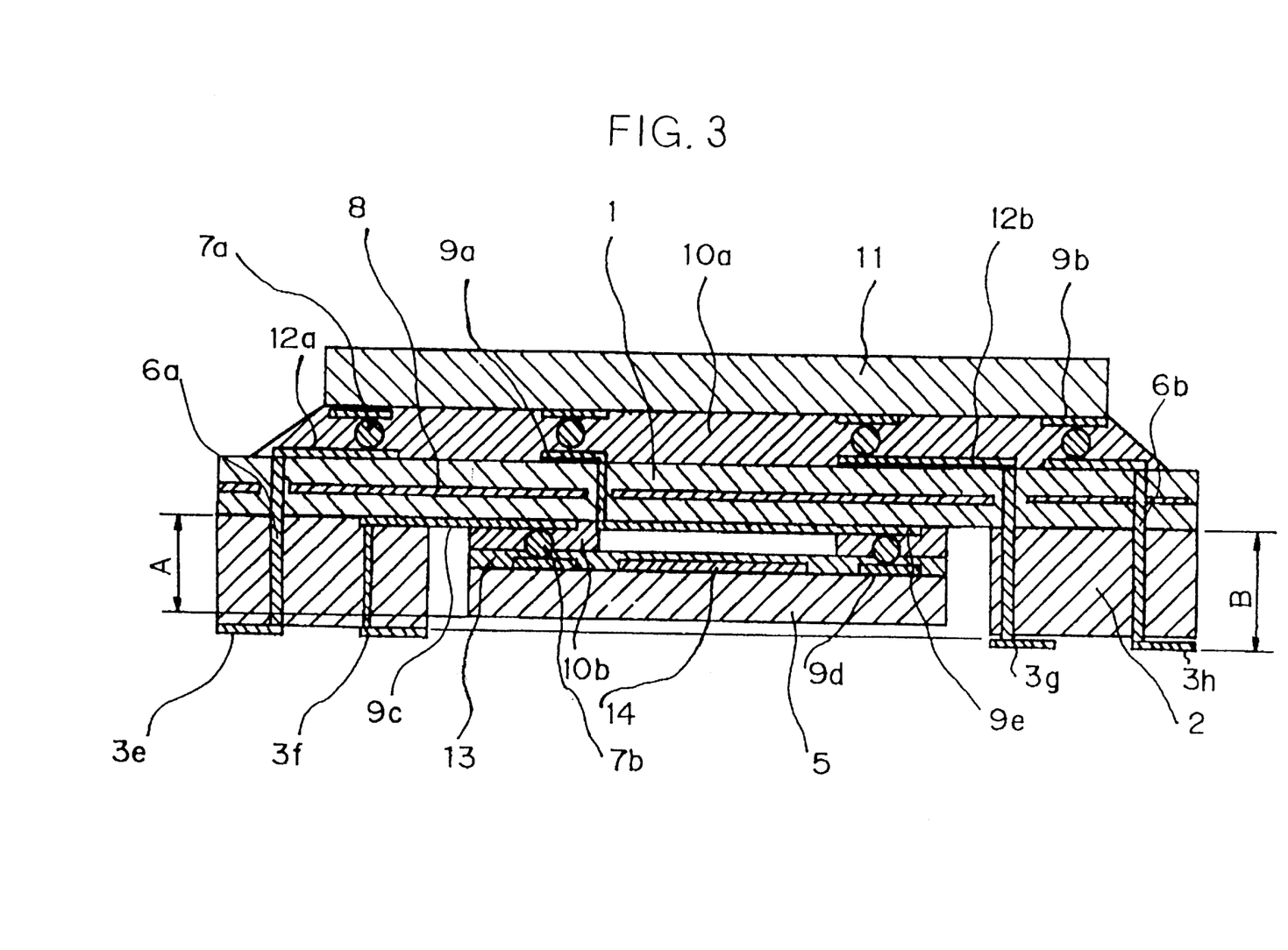
FIG. 3 is a sectional view along line A–A' of FIG. 2.
Figure 4:
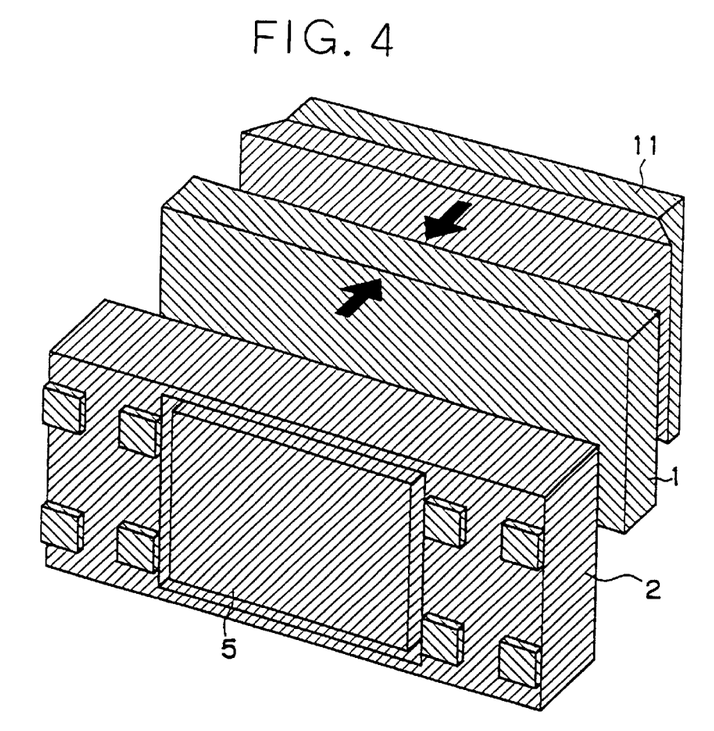
FIG. 4 is an exploded perspective view of the first embodiment.
Figure 5:
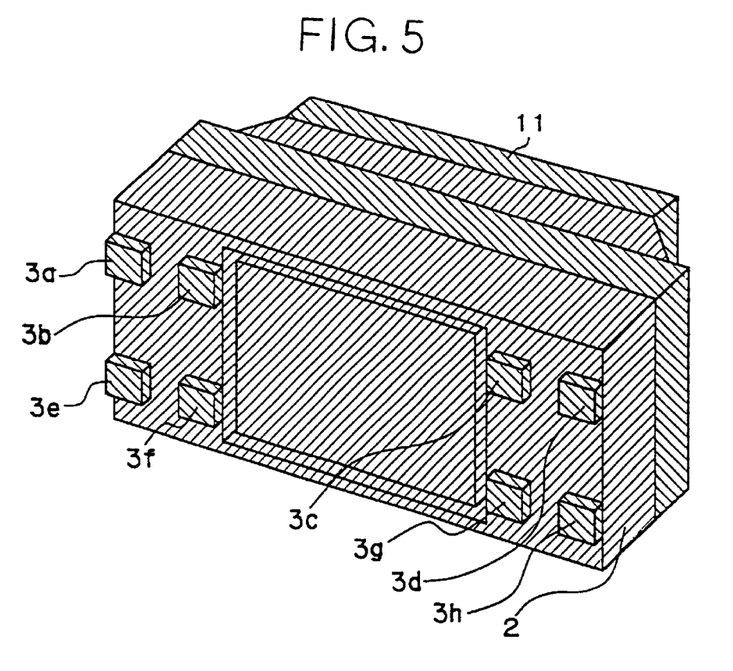
FIG. 5 is a perspective view showing a semiconductor device and a SAW filter device included in the first embodiment in a mounted condition.

Referring to FIGS. 2–5, an MCM embodying the present invention is shown and applied to a receiving section included in a handy phone by way of example. As shown in FIG. 4, the MCM includes a ceramic substrate 1 having an upper major surface and a lower major surface (simply an upper surface and a lower surface hereinafter). A semiconductor device 11 and a SAW filter device 5 are respectively mounted on the upper and lower surfaces of the ceramic substrate 1. Another ceramic substrate 2 is positioned in the area of the lower surface of the ceramic substrate 1 where the SAW filter device 5 is absent. As shown in FIGS. 2 and 5, eight external terminals 3a–3h are formed on the four corner portions of the ceramic substrate 2 to be connected to external circuitry not shown.

The substrates 1 and 2 may be formed of a material other than ceramics, e.g., glass-epoxy resin. In the illustrative embodiment, the semiconductor device 11 and SAW filter device 5 are mounted on the ceramic substrate 1. However, the crux is that at least one of a semiconductor device, a dielectric device and a SAW filter device or similar piezoelectric device be mounted on the ceramic substrate 1. For mounting the above devices to the ceramic substrate 1, use may be made of metallic bumps or conductive adhesive or similar conductive material. The metallic bumps refer to electrodes adapted for a semiconductor chip or wiring leads.

As shown in FIG. 3, in the illustrative embodiment, shield electrodes 8 are formed in the ceramic substrate 1. The semiconductor device 11 and SAW filter device 5 are electrically and physically connected to the upper and lower surfaces of the substrate 1 by metallic bumps 7a and 7b, respectively. The ceramic substrate 2 is positioned in the area of the lower surface of the ceramic substrate 1 where the SAW filter device 5 is absent, as stated earlier. Input/output electrodes 9a, 9d and 9e are formed on the upper and lower surfaces of the ceramic substrate 1. The external terminals 3e–3h are positioned on the lower surface of the ceramic substrate 2 to be connected to external circuitry. The external terminals 3e–3h are electrically connected to the semiconductor device 1 and SAW filter device 5 by conductive patterns 12a and 12b formed on the two substrates 1 and 2 and through holes 6a and 6b formed in the substrates 1 and 2.

Resin 10a is filled in the gap between the ceramic substrate 1 and the semiconductor device 11. The surface of the SAW filter device 5 where interdigital electrodes 14 are present is covered with a protection film 13 formed of, e.g., SiO2 (silicone dioxide). Resin 10b is filled in the gap between the ceramic substrate 1 and the portion of the SAW filter device 5 where the interdigital electrodes 14 are absent. The interdigital electrodes 14 refer to electrodes formed on a piezoelectric or dielectric body and arranged in the form of the teeth of two combs alternating with each other.

The ceramic substrate 1 separates the space accommodating the semiconductor device 11 from the space accommodating the SAW filter device 5. In addition, the shield electrodes 8 isolate an electric field above them and an electric field below them.

The upper surface of the ceramic substrate 2 and the external terminals 3g and 3h define a distance B therebetween. Likewise, the lower surface of the SAW filter device 5 and the metallic bumps 7b and input/output electrodes 9c and 9e define a distance A therebetween. The distance B is selected to be greater than the distance. Should the distance A be greater than the distance B, the SAW filter device 5 would protrude from the lower surface of the ceramic substrate 2 and would abut against a surface to which the MCM should be mounted.

Figure 6:
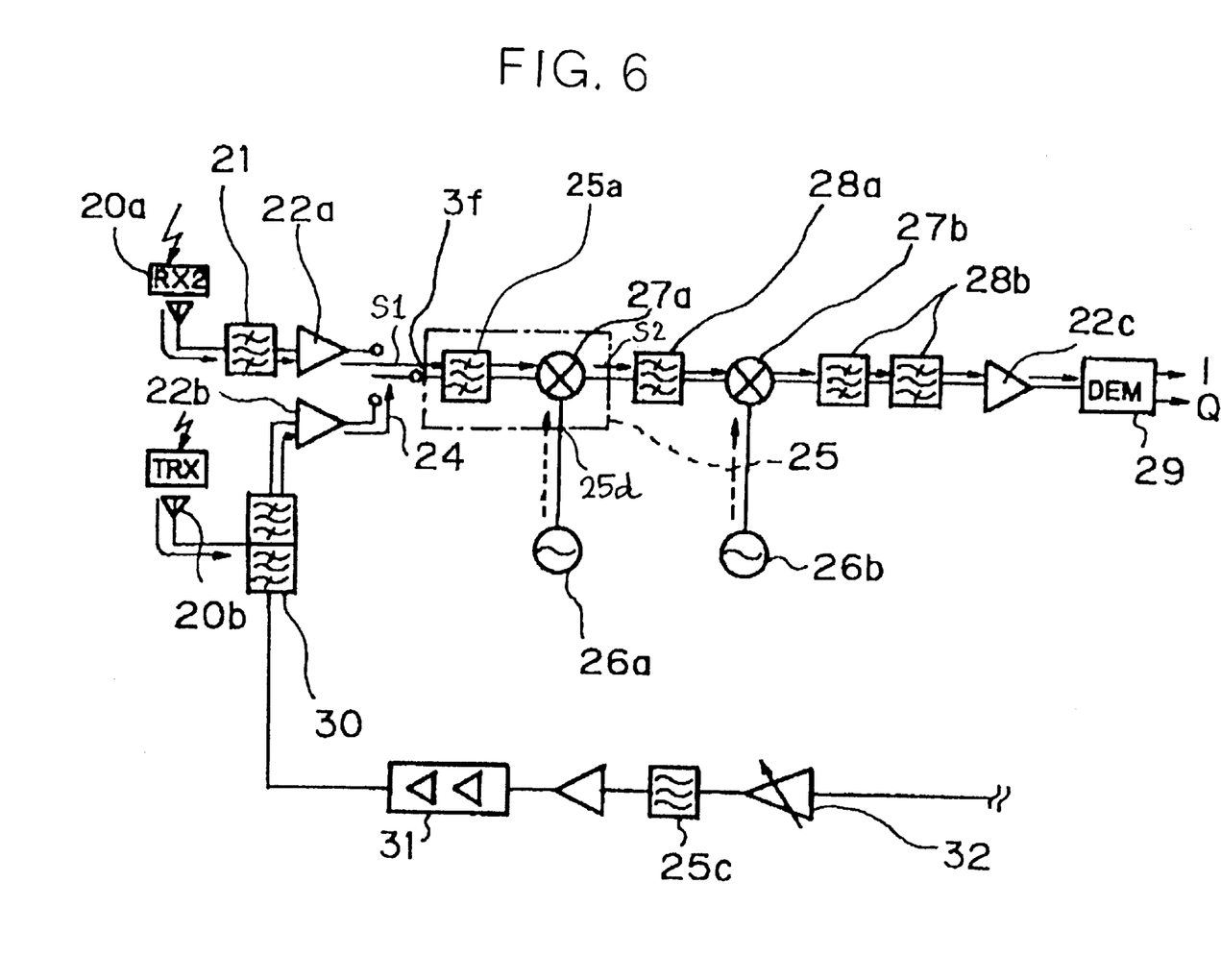
FIG. 6 is a block diagram schematically showing the flow of signals to occur in the radio transmission/receipt section of a handy phone including the first embodiment during receipt.

The operation of the transmission/receipt section of the handy phone including the above MCM will be described hereinafter. FIG. 6 shows the flow of signals to occur in the transmission/receipt section during receipt. As shown, a radio wave comes in through either one of antennas 20a and 20b and is transformed to an electric signal thereby. The electric signal output from the antenna 20b is delivered to the external terminal 3f included in the MCM, labeled 25, via an antenna duplexer 30, an amplifier 22b, and a switch 24. The electric signal output form the other antenna 20a is routed through a receipt filter 21, an amplifier 22a and the switch 24 to the external terminal 3f of the MCM 25. The receipt filter 21 has a center frequency of, e.g., 847.5 MHz.

Figure 7:
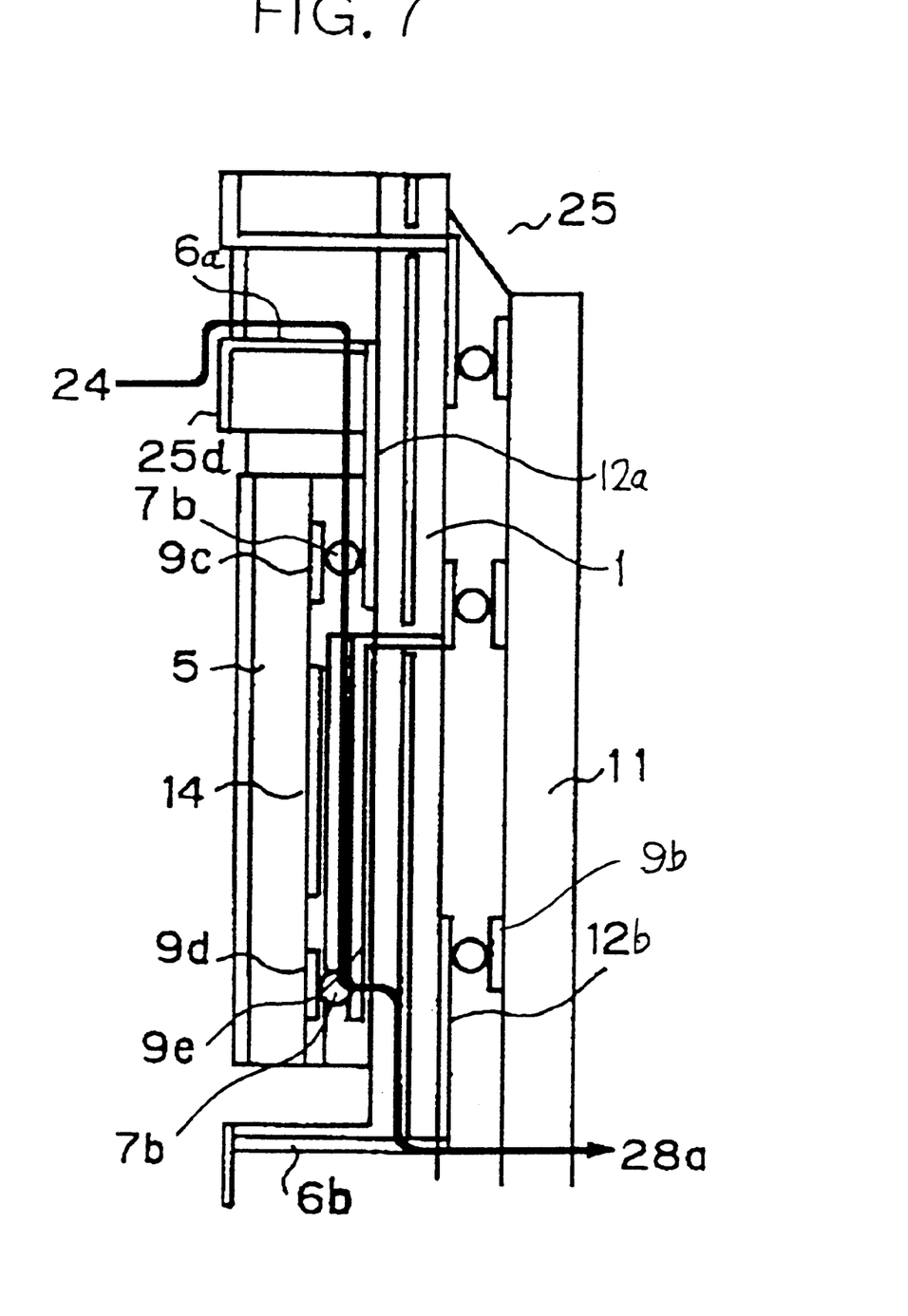
FIG. 7 is an elevation of the first embodiment.

As shown in FIG. 7, the signal applied to the external terminal 3f is fed to the interdigital electrodes 14 of the SAW filter device 5 by way of the associated through hole 6a, conductive pattern 12a, input/output electrode 9c of the ceramic substrate 1, bump 7b, and input/output electrode 9d of the filter device 5.

Figure 8:
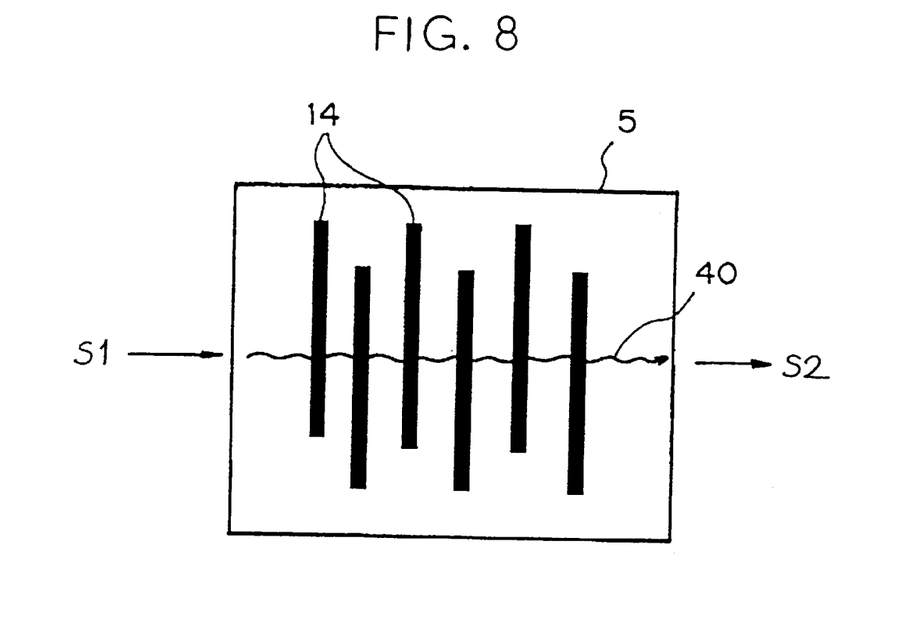
FIG. 8 is a view showing a specific configuration of the SAW filter device and the operation thereof.

More specifically, as shown in FIG. 8, an electric signal S1 is input to the SAW filter device 5 and converted to a surface acoustic wave 40 thereby. The surface acoustic wave 40 is propagated through the interdigital electrodes 14 and again transformed to an electric signal S2. The electric signal S2 is input to the input/output electrode 9e. Why the SAW filter device 5 is used is that is has a sharp frequency characteristic, i.e., it has good frequency selectivity. The characteristic of the output signal S2 derived from the input signal S1 is determined mainly by the pattern design of the interdigital electrodes 14. The SAW filter device 5 is a band-pass filter capable of passing only a preselected frequency band therethrough and has a center frequency of, e.g., 874.5 MHz.

The electric signal S2 output form the SAW filter device 5 is routed through the bump 7b, conductive pattern 12b and through hole 6b to the semiconductor device 11 having a mixing function. A local oscillation signal output from a first local oscillator 26a, as indicated by a dashed arrow in FIG. 6, is input to the semiconductor device 11 via an external terminal 25d also included in the MCM 25, through hole 6a, conductive pattern 12a, and bump 7a.

Figure 9:
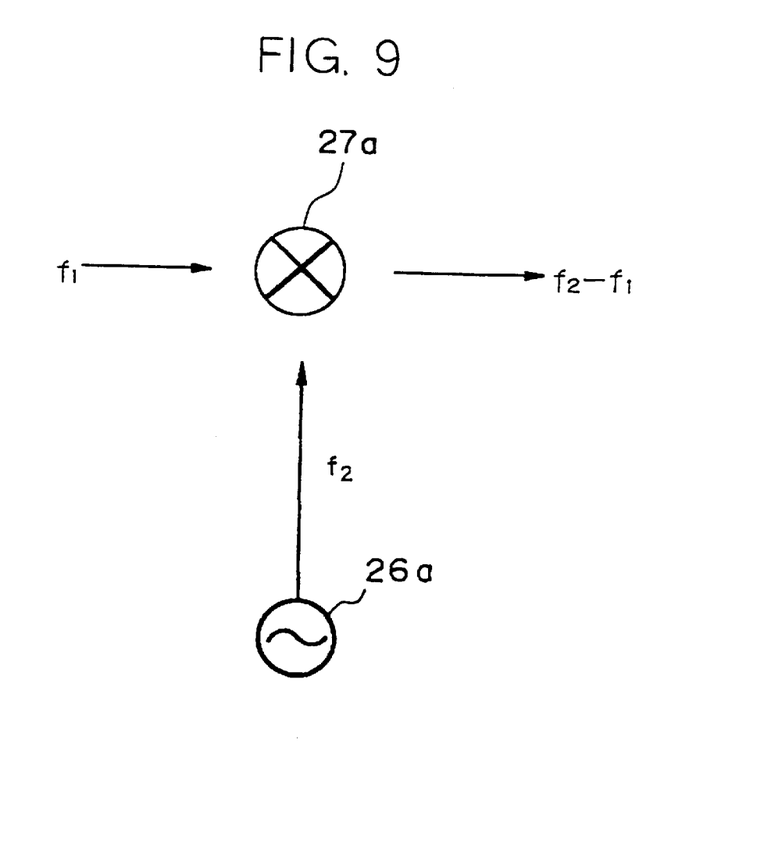
FIG. 9 demonstrates the operation of a first mixer shown in FIG. 6.

As shown in FIG. 9, assume that the signal received via the antenna 20a or 20b has a frequency f1, that the first local oscillator 26b has a frequency f2, and that the frequency f2 is higher than the frequency f1. Then, a first mixer 27a outputs an intermediate frequency produced by f2–f1. Using so-called beating customary with, e.g., a superheterodyne receiver, the first mixer 27a produces a difference between the signal output from the antenna 20a or 20b and the signal output form the first local oscillator 26a. The signal S21 output from the first local oscillator 26a has a frequency of, e.g., 717.5 MHz.

As shown in FIG. 6, the signal S2 is fed from the first mixer 27a to a second mixer 27b via a first intermediate filter 28a. The second mixer 27b produces a signal representative of a difference between the output frequency of the intermediate filter 28b and the frequency of a local oscillation signal output a second local oscillator 28b (indicated by a dashed arrow). This signal is fed from the second mixer 27b to two second intermediate filters 28b.

The first intermediate filter 28a may have a center frequency of 130 MHz while the second intermediate filters 28b may have a center frequency of 450 MHz each. Also, the second local oscillator 26b may have an oscillation frequency of 129.55 MHz.

The signal passed through the second intermediate filters 28b is amplified by an amplifier 22c and then input to a modulator/demodulator (DEM) 29 using the conventional quadrature amplitude modulation scheme. Quadrature amplitude modulation modulates the amplitude of each of two carrier waves different in phase by 90 degrees with a particular digital signal and combines the resulting modulated signals. The DEM 29 outputs signals I and Q subjected to quadrature amplitude modulation. The signals I and Q are respectively the in-phase component and quadrature component of the baseband signal subjected to the above modulation.

Figure 10:
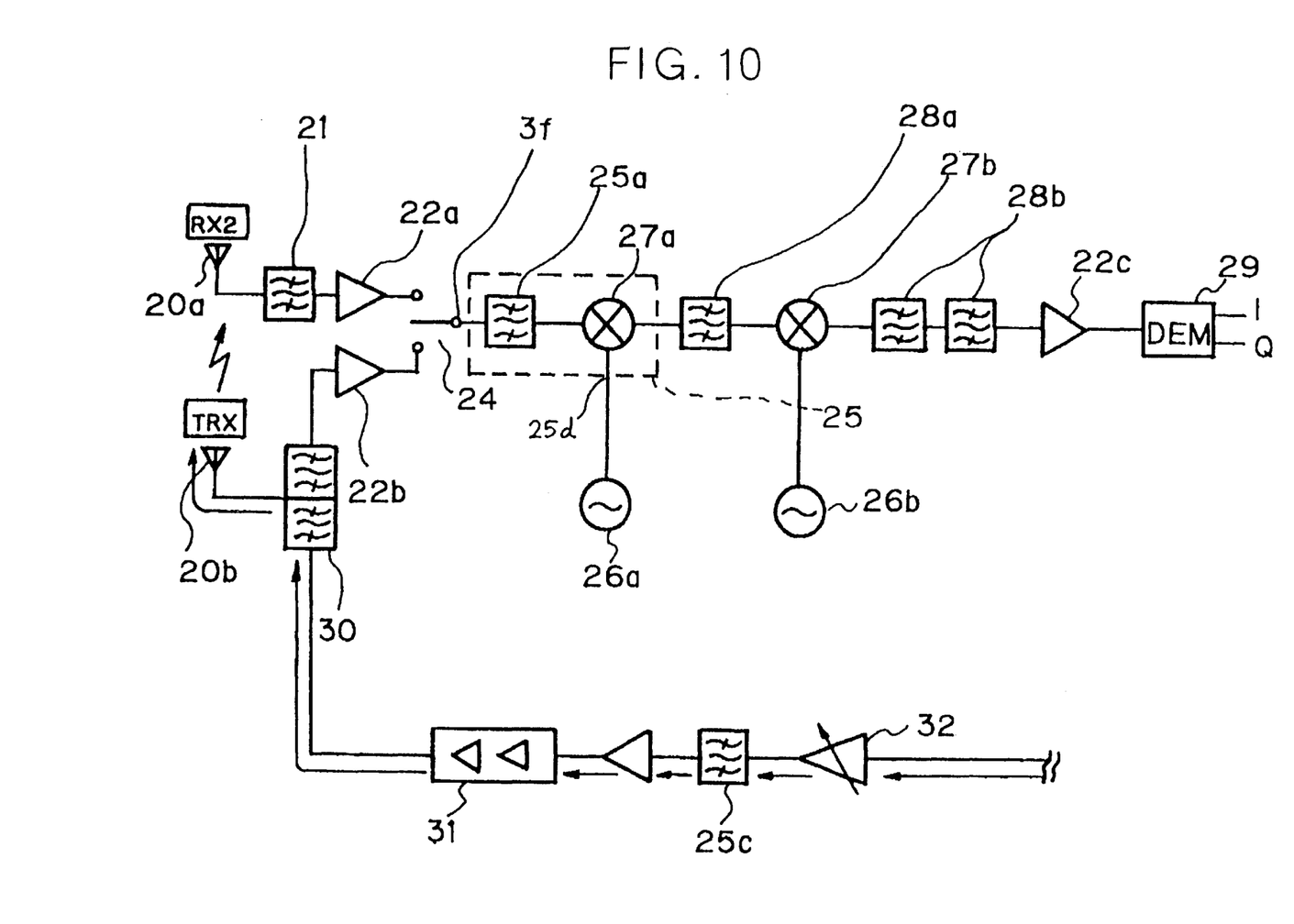
FIG. 10 is a block diagram schematically showing the flow of signals to occur in the radio transmission/receipt section during transmission.

FIG. 10 shows the flow of signals to occur in the transmission/receipt section during transmission. The transmission of a signal will be described only briefly because it is not relevant to the understanding of the illustrative embodiment. As shown, an AGC (Automatic Gain Control) 32 amplifies a signal to be transmitted such that a preselected gain is obtainable. Specifically, the AGC 32 automatically controls the gain of an amplifier in such a manner as to produce a preselected output. The output of the AGC 32 is passed through a SAW filter device 25c to a power amplifier 31 and amplified thereby. The amplified output of the power amplifier 31 is radiated via the antenna duplexer 30 and antenna 20b. The SAW filter device 25c on the transmission side has an oscillation frequency of, e.g., 942.5 MHz.

As stated above, the illustrative embodiment has the semiconductor device 11 and SAW filter device 5 mounted on the opposite major surfaces of the ceramic substrate 1. This successfully increases the mounting efficiency. In addition, the external terminals 3a–3h formed on the ceramic substrate 2 allow the MCM to be easily connected to external circuitry.

2nd Embodiment

Figure 11:
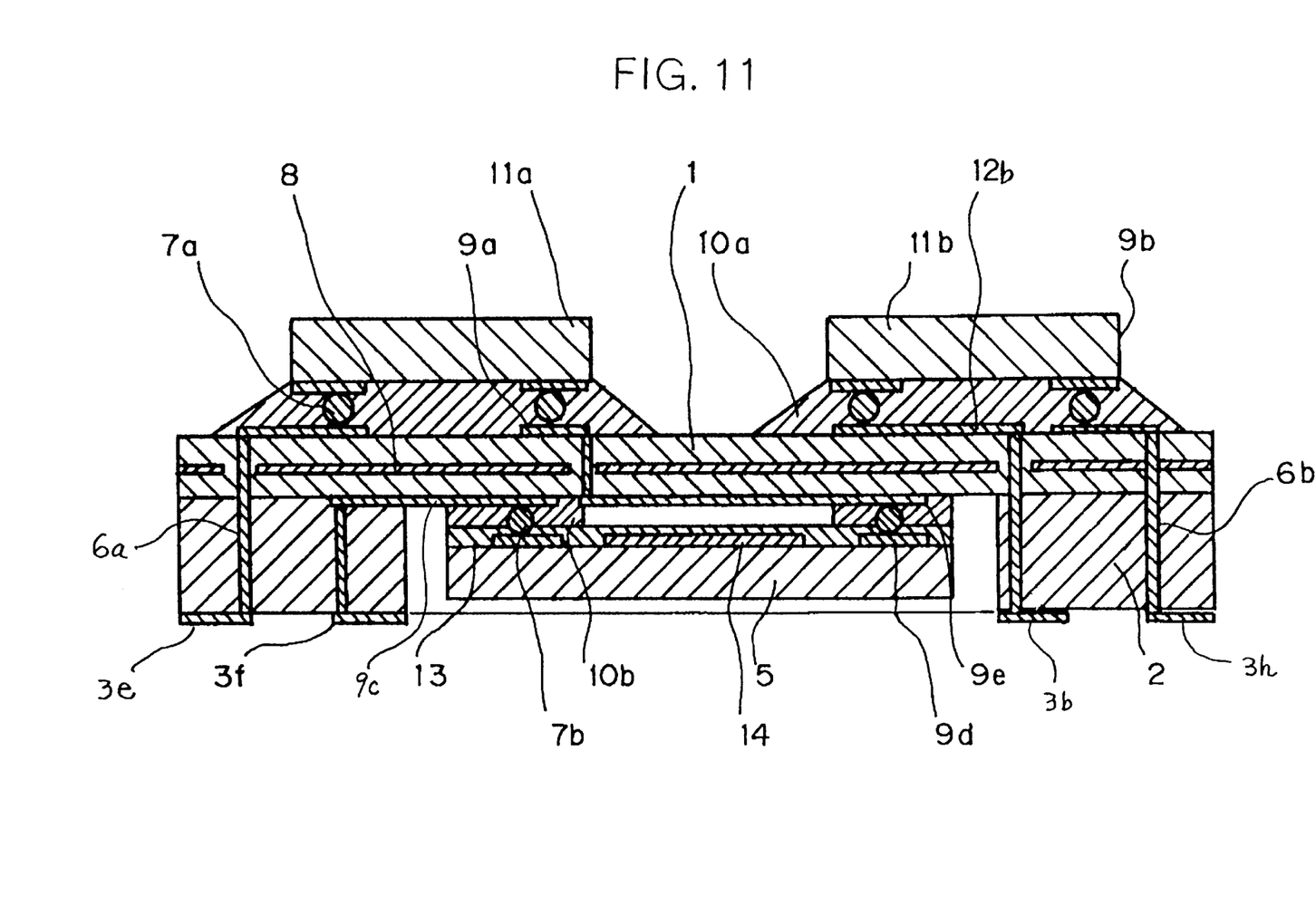
FIG. 11 is a sectional view showing a second embodiment of the present invention.
Figure 12:
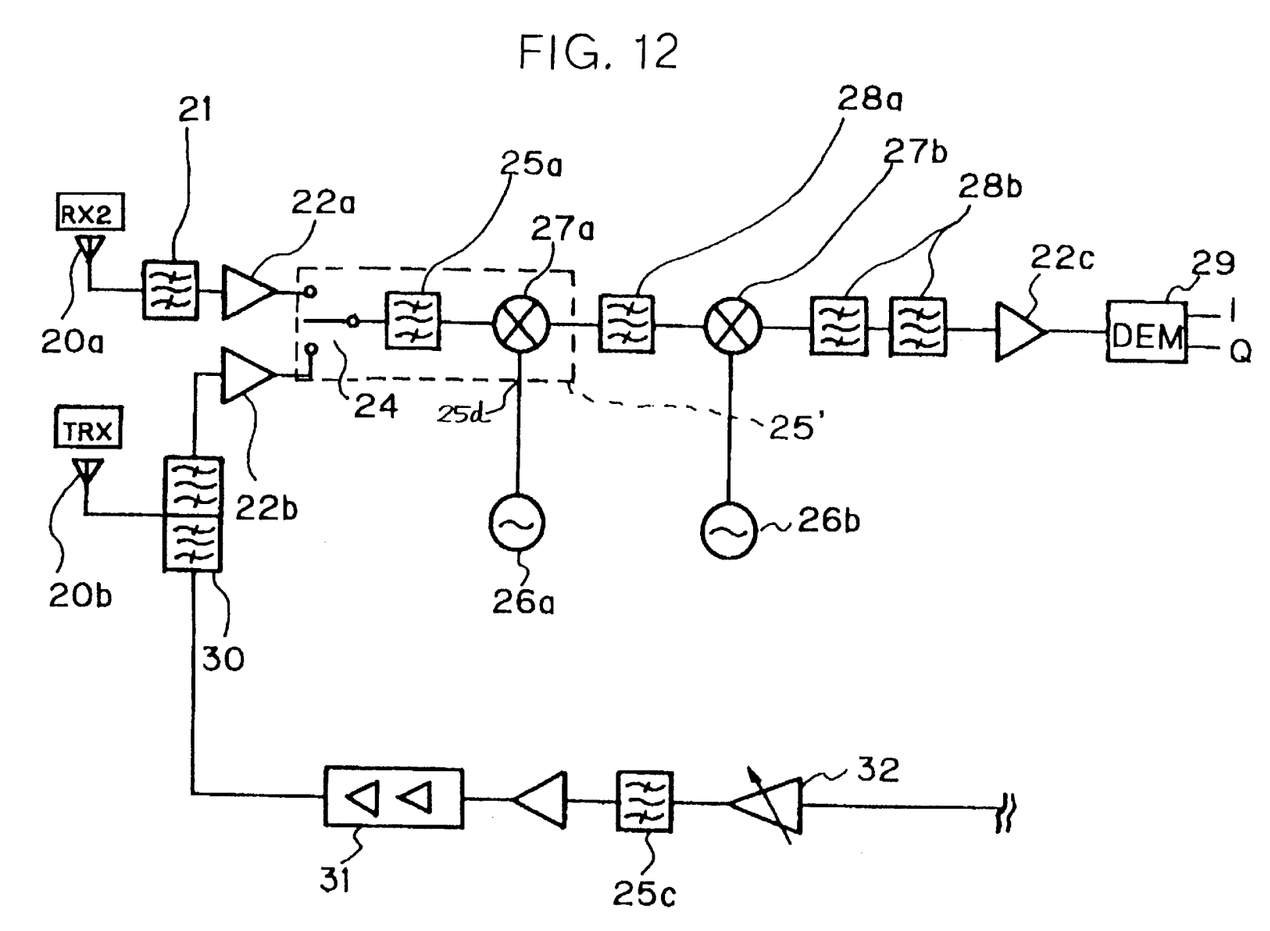
FIG. 12 is a block diagram schematically showing the radio transmission/receipt section of a handy phone including the second embodiment.

FIG. 11 shows an alternative embodiment of the present invention. As shown, this embodiment is identical with the first embodiment except that two semiconductor devices 11a and 11b are mounted on the ceramic substrate 1. FIG. 12 shows the radio transmission/receipt section of a handy phone including an MCM representative of the second embodiment. In FIG. 12, the MCM is generally designated by the reference numeral 25'. The operation of the second embodiment is identical with the operation of the first embodiment and will not be described specifically in order to avoid redundancy.

The semiconductor devices 11a and 11b mounted on the upper surface of the ceramic substrate 1 enhance efficient mounting for a modular configuration and broaden the selectable range of modules.

3rd Embodiment

Figure 13:
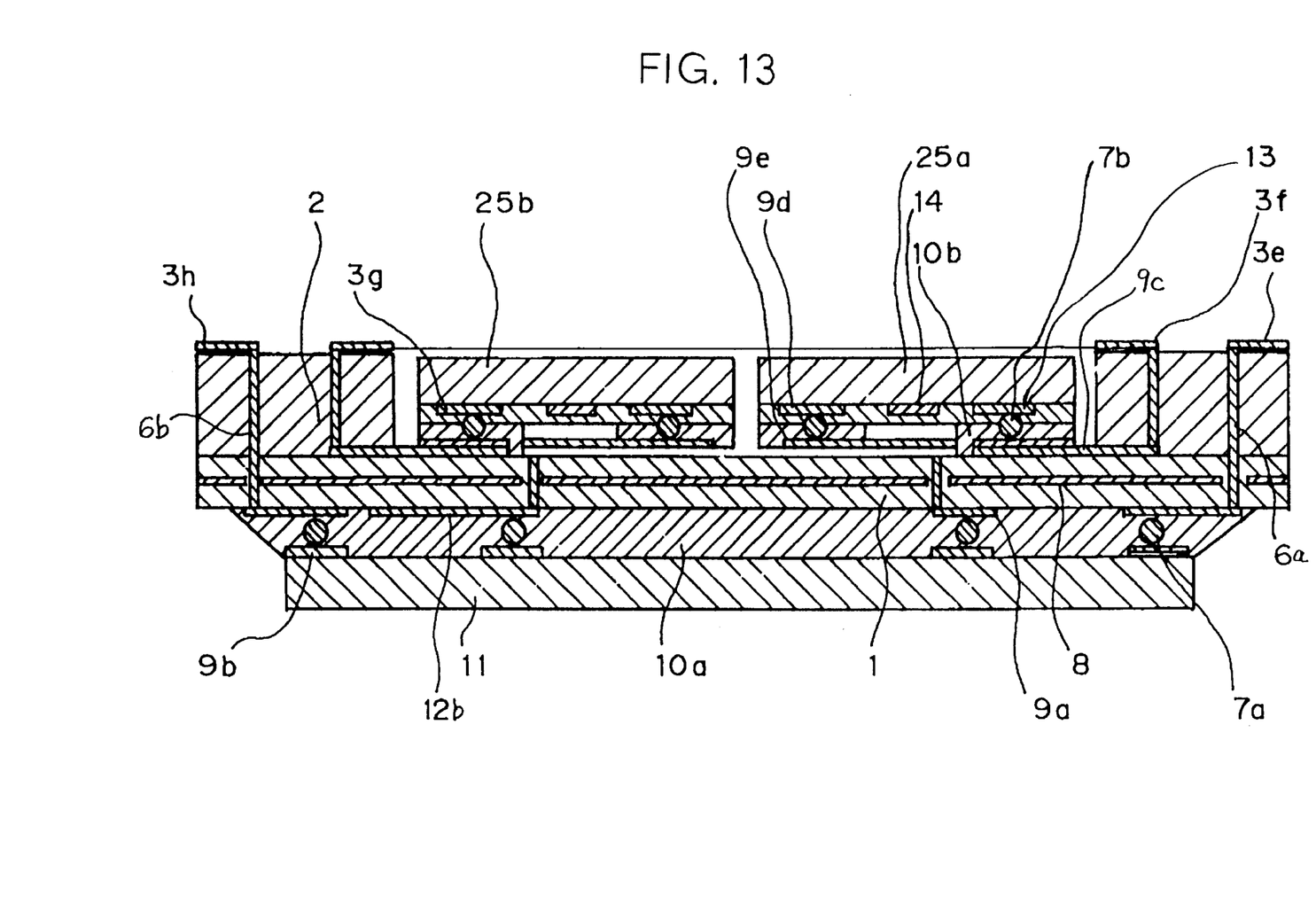
FIG. 13 is a sectional view showing a third embodiment of the present invention.
Figure 14:
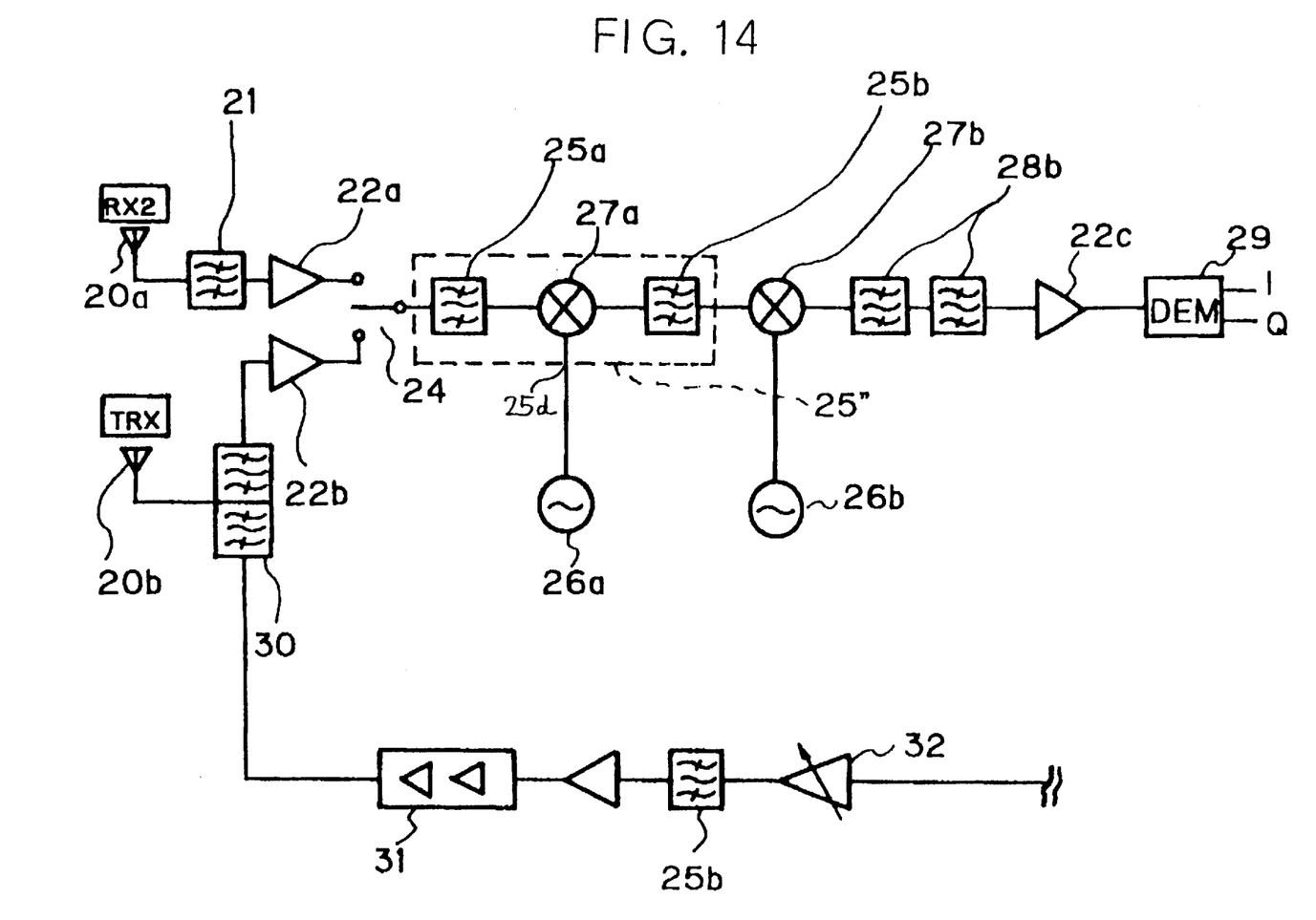
FIG. 14 is a schematic block diagram showing the radio transmission/receipt section of a handy phone including the third embodiment.

FIG. 13 shows another alternative embodiment of the present invention. As shown, this embodiment differs from the first embodiment in that two SAW filter devices 25a and 25b are mounted on the upper surface of the ceramic substrate 1 while the semiconductor device 11 is mounted on the lower surface of the substrate 1. FIG. 14 shows the radio transmission/receipt section of a handy phone including an MCM representative of the third embodiment. In FIG. 14, the MCM is generally designated by the reference numeral 25".

The third embodiment is substantially identical in operation with the second embodiment.

The SAW filter devices 25a and 25b mounted on the upper surface of the ceramic substrate 1 also enhance efficient mounting for a modular configuration and broaden the selectable range of modules.

4th Embodiment

Figure 15:
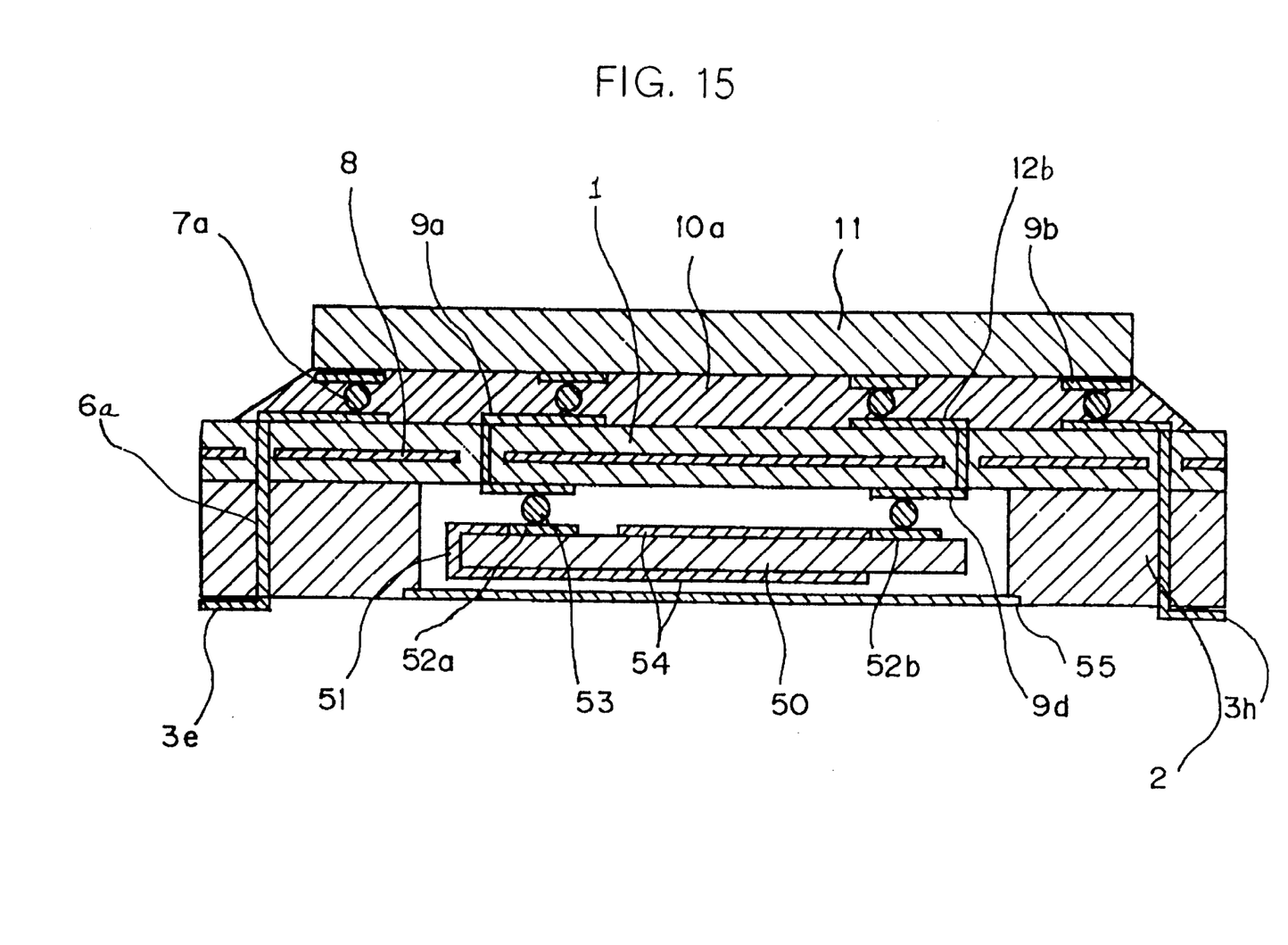
FIG. 15 is a sectional view showing a fourth embodiment of the present invention.

Reference will now be made to FIG. 15 for describing a further alternative embodiment of the present invention. As shown, this embodiment is similar to the first embodiment except that a quartz device 50 is substituted for the SAW filter device 5. An oscillator using quartz has customarily used in a handy phone as a reference oscillation frequency source. In this case, the oscillator is usually implemented as a temperature compensated oscillator (TCXO) because it must be highly stable. A metallic cover 55 is used in combination with the quartz device 50 in order to seal it. Specifically, the cover 55 hermetically seals the quartz device 50 in order to protect oscillation electrodes provided on the opposite sides of quartz from oxidation. There are also shown in FIG. 15 lead electrodes 51. Input/output electrodes 52a and 52b, conductive adhesive 53, and oscillation electrodes 54.

Figure 16:
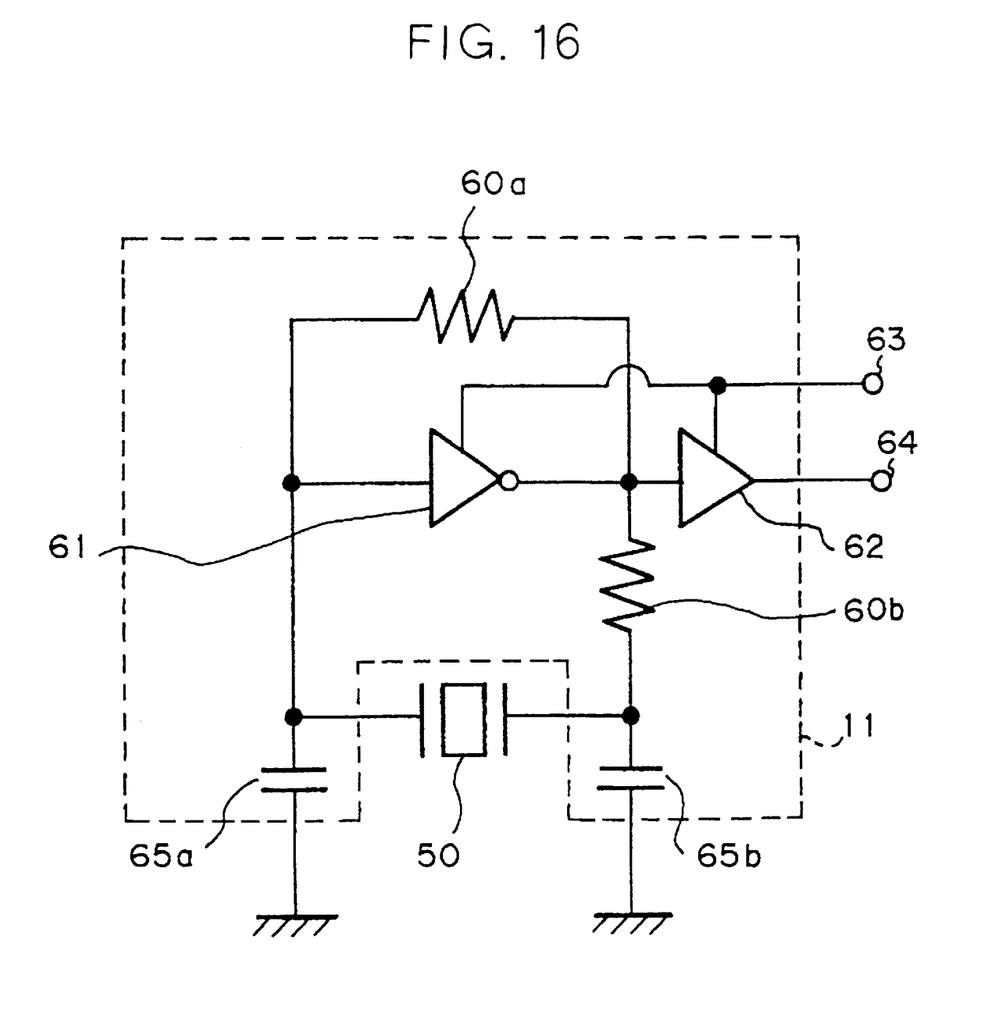
FIG. 16 shows an equivalent circuit representative of a quartz device included in the fourth embodiment.

FIG. 16 shows an equivalent circuit representative of the quartz device 50. As shown, the semiconductor device 11 implements an oscillation circuit made up of resistors 60a and 60b, an inverter 61, a buffer amplifier 62 and capacitors 65a and 65b. The oscillation circuit has a bias terminal 63 and an output terminal 64.

In summary, it will be seen that the present invention provides an MCM allowing different devices to be mounted on the opposite major surfaces of a substrate and thereby enhancing efficient mounting. Structural members other than the devices mounted on the MCM are reduced in size as far as possible and therefore light weight. Furthermore, spaces above and below the substrate for mounting the devices are isolated by the substrate. Therefore, shield electrodes arranged in the substrate isolate electric fields above and below the substrate, promoting easy insulation between the devices.

Various modifications will become possible for those skilled in the art after receiving the teachings of the present disclosure without departing from the scope thereof.

What is claimed is:

1. A multichip module comprising:
   a first substrate formed with through holes and having shield electrodes arranged therein;
   at least one semiconductor device mounted on one of opposite major surfaces of said first substrate and electrically and mechanically connected to said first substrate by a first conductive material;
   a second substrate formed with through holes; and
   at least one filter device mounted on the other major surface of said first substrate and electrically and mechanically connected to said first substrate by a second conductive material; and
   said second substrate being mounted on said other major surface of said first substrate and electrically connected to said semiconductor device by said through holes and said first conductive material.

2. A multichip module as claimed in claim 1, wherein two semiconductor devices are mounted on said one major surface of said first substrate.

3. A multichip module as claimed in claim 2, wherein two filter devices are mounted on said other major surface of said first substrate.

4. A multichip module as claimed in claim 3, further comprising resin intervening between said first substrate and said two semiconductor devices and between said first substrate and said two filter devices.

5. A multichip module as claimed in claim 4, wherein said filter devices comprise SAW filter devices.

6. A multichip module as claimed in claim 2, wherein a quartz device is mounted in place of said filter devices.

7. A multichip module as claimed in claim 1, wherein two filter devices are mounted on said other major surface of said first substrate.

8. A multichip module as claimed in claim 1, further comprising resin intervening between said first substrate and said at least one semiconductor device and between said first substrate and said at least one filter device.

9. A multichip module as claimed in claim 1, wherein said at least one filter device comprises a SAW filter device.

10. A multichip module as claimed in claim 1, wherein a quartz device is mounted in place of said at least one filter device.

11. A multichip module as claimed in claim 1, wherein said second substrate surrounds said at least one filter device.

12. A multichip module as claimed in claim 1, wherein said second substrate includes external terminals formed on corner portions thereof.

13. A multichip module as claimed in claim 1, wherein said first and second conductive material includes metallic bumps, conductive adhesive or conductive material.

14. A multichip module as claimed in claim 13, further comprising input/output electrodes formed on the major surfaces of said first substrate and connecting to said first and second conductive material.

15. A multichip module as claimed in claim 14, wherein an upper surface of said second substrate and external terminals formed thereon define a first distance and a lower surface of said at least one filter device and said second conductive material define a second distance, where said first distance is greater than said conductive distance.

16. A multichip module as claimed in claim 1, further comprising a first gap formed between said first substrate and said at least one semiconductor device and second gap formed between said first substrate and said at least one filter device.

17. A multichip module as claimed in claim 16, further comprising resin filling said first gap and said second gap.

18. A multichip module as claimed in claim 1, further comprising interdigital electrodes on a surface of said at least one filter device facing the other major surface of said first substrate.

19. A multichip module as claimed in claim 18, further comprising a protection film formed over said interdigital electrodes.

20. A multichip module as claimed in claim 18, further comprising a second gap formed between said first substrate where said interdigital electrodes are absent and said at least one filter device.

21. A multichip module as claimed in claim 1, further comprising a cover formed on a surface of said second substrate opposing and covering said at least one filter.

* * * * *